United States Patent
Hsu

(10) Patent No.: US 9,483,097 B2
(45) Date of Patent: Nov. 1, 2016

(54) POWER-FREE WIRELESS OPERATION DEVICE OF PORTABLE ELECTRONIC DEVICE

(71) Applicants: Diwin Technology Co., Ltd., Taoyuan (TW); Ping-Ping Lee, Taoyuan (TW)

(72) Inventor: Ching-Han Hsu, Taipei (TW)

(73) Assignees: DIWIN TECHNOLOGY CO., LTD., Taoyuan (TW); PING-PING LEE, Taoyuan (TW)

( * ) Notice: Subject to any disclaimer, the term of this patent is extended or adjusted under 35 U.S.C. 154(b) by 2 days.

(21) Appl. No.: 14/598,243

(22) Filed: Jan. 16, 2015

(65) Prior Publication Data

US 2016/0209898 A1  Jul. 21, 2016

(51) Int. Cl.
*H04B 1/38* (2015.01)
*G06F 1/26* (2006.01)
*H03H 7/38* (2006.01)
*H04M 1/725* (2006.01)

(52) U.S. Cl.
CPC ........... *G06F 1/266* (2013.01); *H03H 7/38* (2013.01); *H04M 1/7253* (2013.01); *G06F 1/26* (2013.01); *H04B 1/38* (2013.01); *H04M 2250/02* (2013.01)

(58) Field of Classification Search
CPC .......... G06F 1/266; G06F 1/26; H03H 7/38; H04M 1/7253; H04M 2250/02; H04B 1/38
USPC ........................................................ 455/557
See application file for complete search history.

(56) References Cited

U.S. PATENT DOCUMENTS

| 9,160,196 B2* | 10/2015 | Endo ........................ H02J 7/025 |
| 2009/0189769 A1* | 7/2009 | Schaffler .............. G06K 7/0008 340/572.7 |
| 2011/0053637 A1* | 3/2011 | Filipovic .................. H04B 1/38 455/552.1 |
| 2011/0127953 A1* | 6/2011 | Walley ............... G06K 7/10207 320/108 |
| 2014/0329467 A1* | 11/2014 | Ewing .................... H04W 8/005 455/41.2 |
| 2015/0022012 A1* | 1/2015 | Kim ...................... H04B 5/0037 307/104 |
| 2015/0365737 A1* | 12/2015 | Miller .................... G01D 4/002 340/870.02 |

FOREIGN PATENT DOCUMENTS

CN  103823565  *  5/2014  ............... G06F 3/02

OTHER PUBLICATIONS

Patent Translate of Description CN103823565 (Powered by EPO and Google) 5 pages.*

* cited by examiner

*Primary Examiner* — Mong-Thuy Tran
(74) *Attorney, Agent, or Firm* — Leong C. Lei

(57) ABSTRACT

A power-free wireless operation device of a portable electronic device includes a portable electronic device that includes a device-side matching unit, a radio frequency unit, a device-side wireless communication interface, and a message processing unit and a wireless operation mechanism that includes a matching unit, a current processing unit, a wireless communication interface, and an operation processing unit. As such, a keyboard is operable with power supply from a portable electronic device so that the keyboard does not need to be equipped with an own power supply, whereby the present invention allows for significant reduction of the size of a wireless operation device and, in manufacture and production, a design can be adopted to achieve the features of being light, thin, and compact and being readily foldable for easy carrying and providing an effect of environmental protection through regeneration.

5 Claims, 4 Drawing Sheets

POWER-FREE WIRELESS OPERATION DEVICE OF PORTABLE ELECTRONIC DEVICE

TECHNICAL FIELD OF THE INVENTION

The present invention generally relates to innovation of a power-free wireless operation device of a portable electronic device, and more particularly to a keyboard that is operable with power supply from a portable electronic device so that the keyboard itself is not equipped with an own power supply whereby the present invention allows for significant reduction of the size of a wireless operation device and, in manufacture and production, a design can be adopted to achieve the features of being light, thin, and compact and being readily foldable for easy carrying and providing an effect of environmental protection through regeneration.

DESCRIPTION OF THE PRIOR ART

Recently, to meet the needs of operation for portable electronic devices (such as all sorts of handheld device, including smart phones and tablet computers), conventional externally connected keyboards are evolved from a wired device to a wireless device.

Most of the wireless keyboards uses Bluetooth communication protocols to set connection with portable electronic device. The wireless keyboard must be equipped with batteries to supply electric power necessary for the operation thereof The supply of electric power is generally achieved with two types of battery, one being removable batteries and the other being fixed batteries. The structures of both types of battery require an accommodation space preserved in the keyboard for receiving and holding the batteries. As such, keyboards with these two types of battery have a large size, making it hard to carry. Further, all types of battery suffer limitation of lifespans. Once a battery runs out of electric power, the battery must be replaced, if it is a removable one, or the keyboard must be disposed of if the battery is a fixed battery. Both are adverse to environmental protection and regeneration for reuse.

SUMMARY OF THE INVENTION

The primary object of the present invention is to a keyboard to be operable with power supply from a portable electronic device so that the keyboard itself is not equipped with an own power supply whereby the present invention allows for significant reduction of the size of a wireless operation device and, in manufacture and production, a design can be adopted to achieve the features of being light, thin, and compact and being readily foldable for easy carrying and providing an effect of environmental protection through regeneration.

To achieve the above object, the present invention provides a power-free wireless operation device of a portable electronic device, which comprises a portable electronic device and a wireless operation mechanism operable in combination with the portable electronic device, characterized in that:

the portable electronic device comprises:

a device-side matching unit, which functions for impedance matching and supplying radio frequency energy to the wireless operation mechanism;

a radio frequency unit, which is connected to the device-side matching unit for supplying electric power;

a device-side wireless communication interface, which is connected to the device-side matching unit for achieving wireless connection; and a message processing unit, which is connected to the device-side wireless communication interface for analyzing and converting information; and the wireless operation mechanism comprises:

a matching unit, which is for impedance matching with the device-side matching unit to acquire the radio frequency energy;

a current processing unit, which is connected to the matching unit to proceed with rectification of the acquired radio frequency energy into electric power;

a wireless communication interface, which is connected to the matching unit and the current processing unit and, after receiving electrical power, proceeds with handshaking communication with the device-side wireless communication interface; and an operation processing unit, which is connected to the current processing unit and the wireless communication interface and, after receiving electrical power, with analysis and conversion performed with the message processing unit, executes an input instruction.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
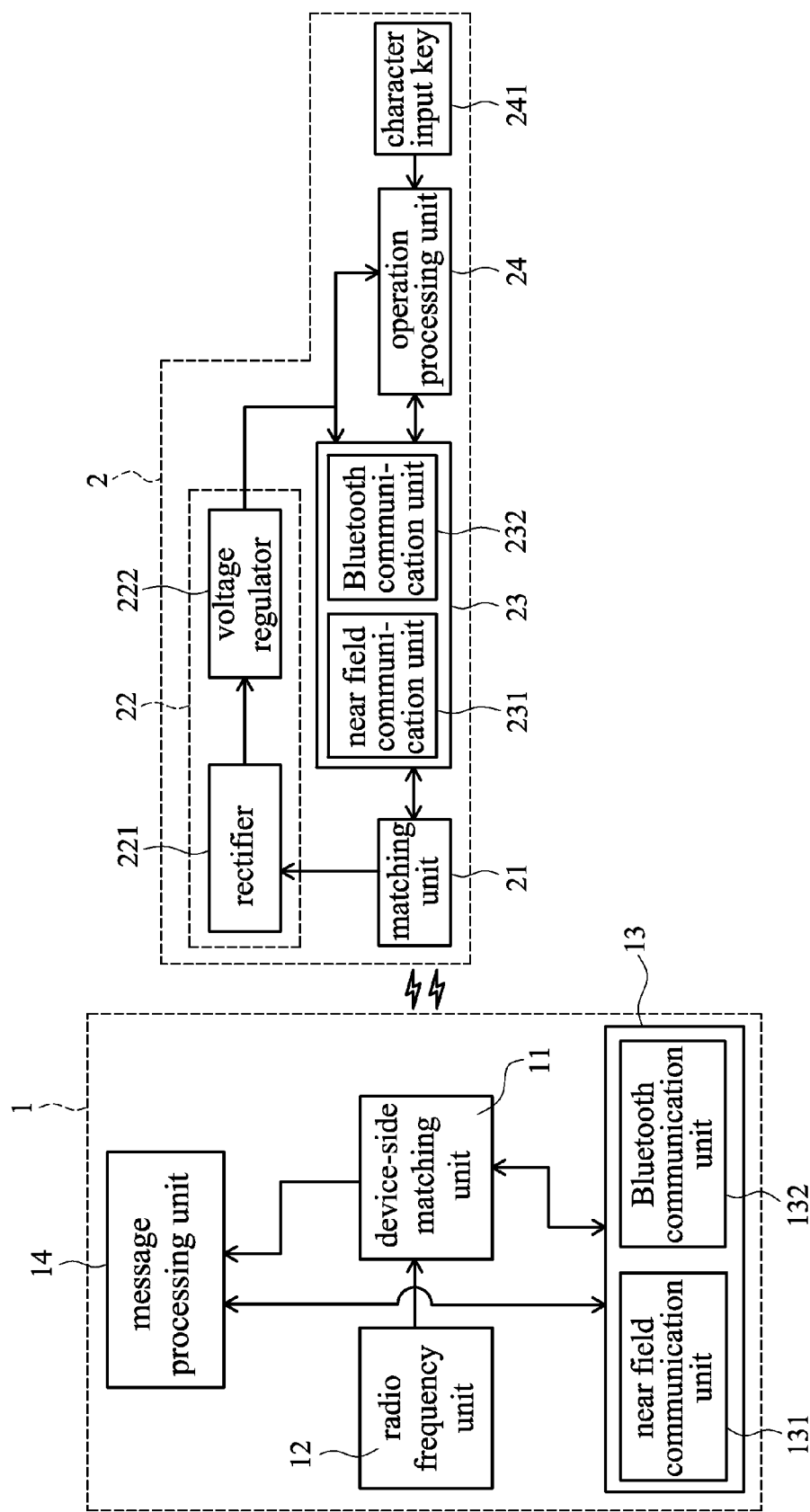
FIG. 1 is a block diagram illustrating an architecture of the present invention.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring to FIGS. 1, 2, 3, and 4, which are respectively a block diagram illustrating architecture of the present invention, a perspective view illustrating a use of the present invention, a schematic view illustrating another wireless operation mechanism according to the present invention, and a flow chart illustrating a process of transmission through near field communication (NFC) according to the present invention, as shown in the drawings, the present invention provides a power-free wireless operation device applicable to a portable electronic device, which is composed of a portable electronic device 1 and a wireless operation mechanism 2.

The portable electronic device 1 mentioned above can be one of various handheld devices, such as a smart phone and a tablet computer, and comprises:

a device-side matching unit 11, which functions for impedance matching and supplying radio frequency energy to the wireless operation mechanism;

a radio frequency unit 12, which is connected to the device-side matching unit 11 for supplying electric power;

a device-side wireless communication interface 13, which is connected to the device-side matching unit 11 for achieving wireless connection, the device-side wireless communication interface 13 comprising a near field communication (NFC) unit 131 and a Bluetooth communication unit 132; and a message processing unit 14, which is connected to the device-side wireless communication interface 13 for analyzing and converting information.

The wireless operation mechanism 2 comprises:

a matching unit 21, which is for impedance matching with the device-side matching unit 11 to acquire the radio frequency energy;

a current processing unit 22, which is connected to the matching unit 21 to proceed with rectification of the acquired radio frequency energy into electric power, the current processing unit 22 comprising a rectifier 221 and a voltage regulator 222 connected to the rectifier 221;

a wireless communication interface 23, which is connected to the matching unit 21 and the current processing unit 22 and, after receiving electrical power, proceeds with handshaking communication with the device-side wireless communication interface 13, the wireless communication interface 23 comprising a near field communication unit 231 and a Bluetooth communication unit 232;

an operation processing unit 24, which is connected to the voltage regulator 222 of the current processing unit 22 and the wireless communication interface 23 and, after receiving electrical power, with analysis and conversion performed with the message processing unit 14, executes an input instruction, the operation processing unit 24 being connected to a plurality of character input keys 241 that is capable of executing an operation of input. As such, a brand new power-free wireless operation device applicable to a portable electronic device is formed.

Figure 2:
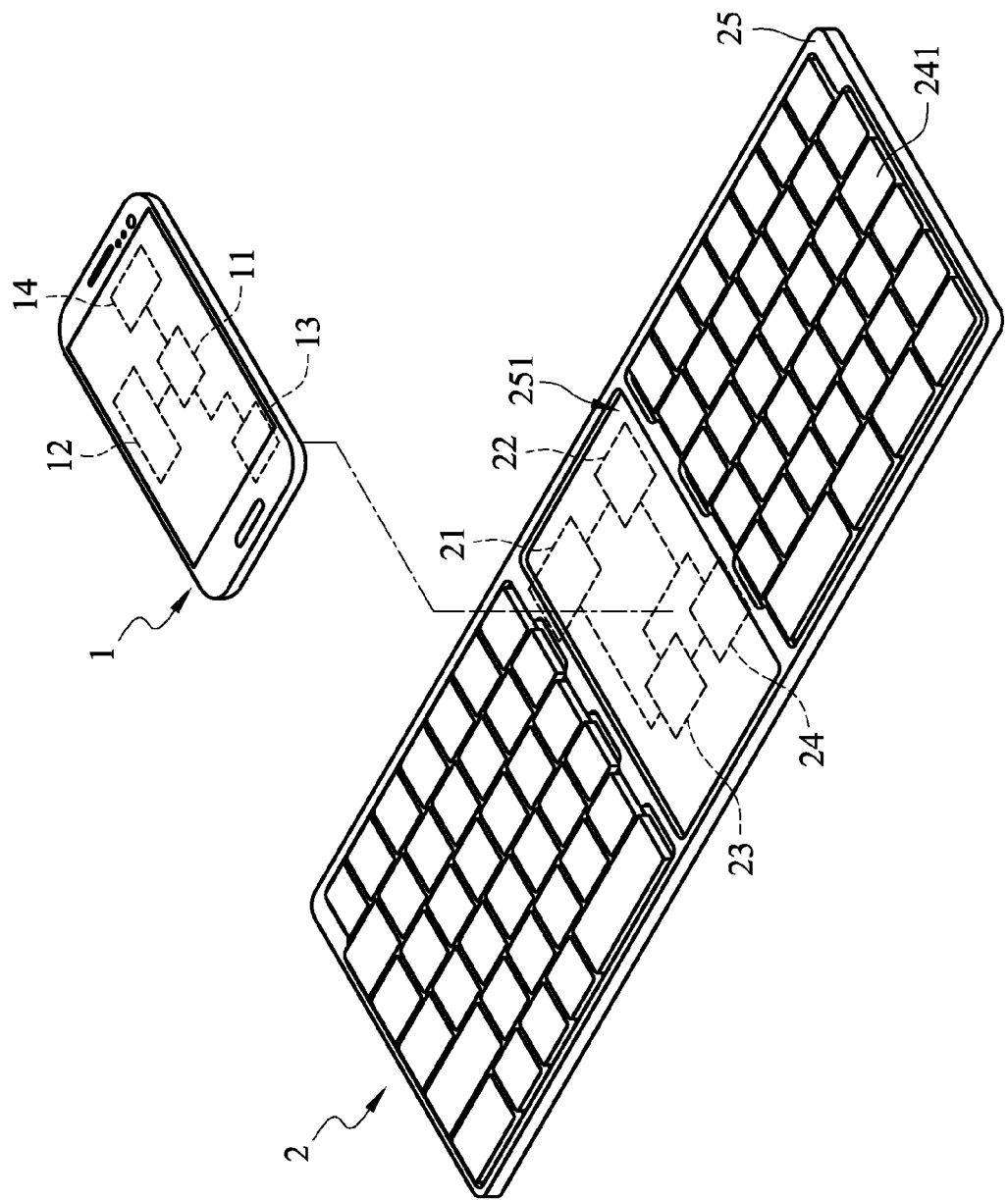
FIG. 2 is a perspective view illustrating a use of the present invention.
Figure 3:
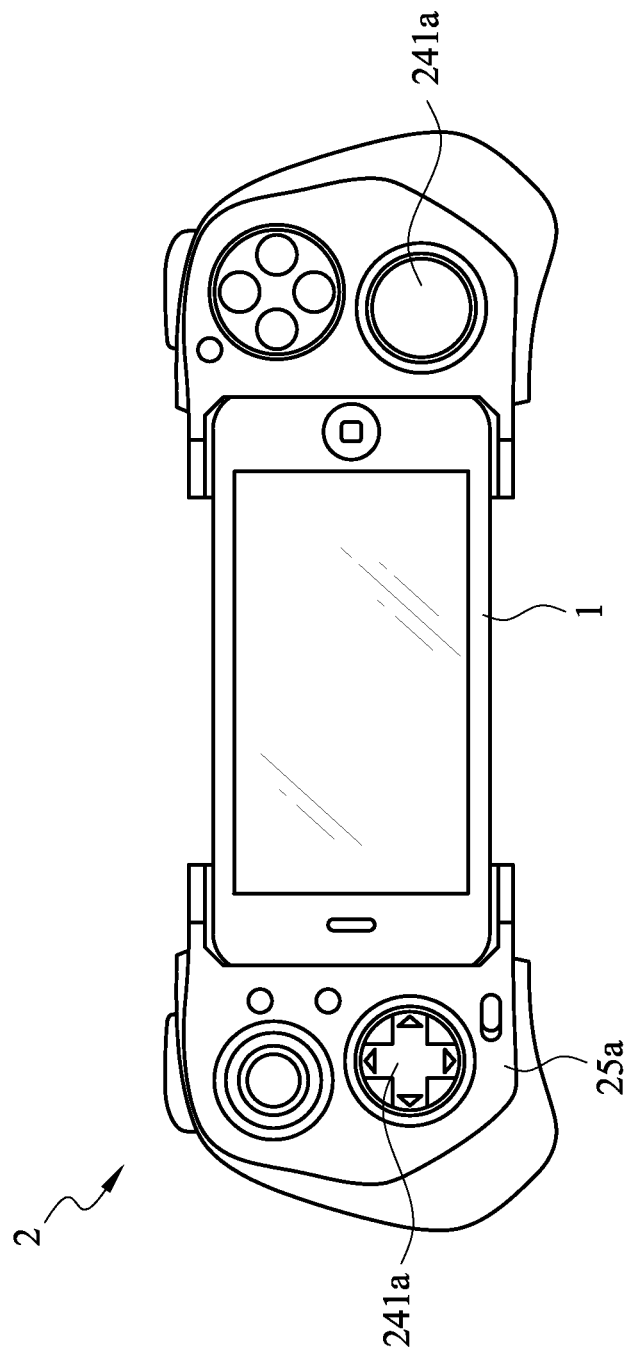
FIG. 3 is a schematic view illustrating another wireless operation mechanism according to the present invention.
Figure 4:
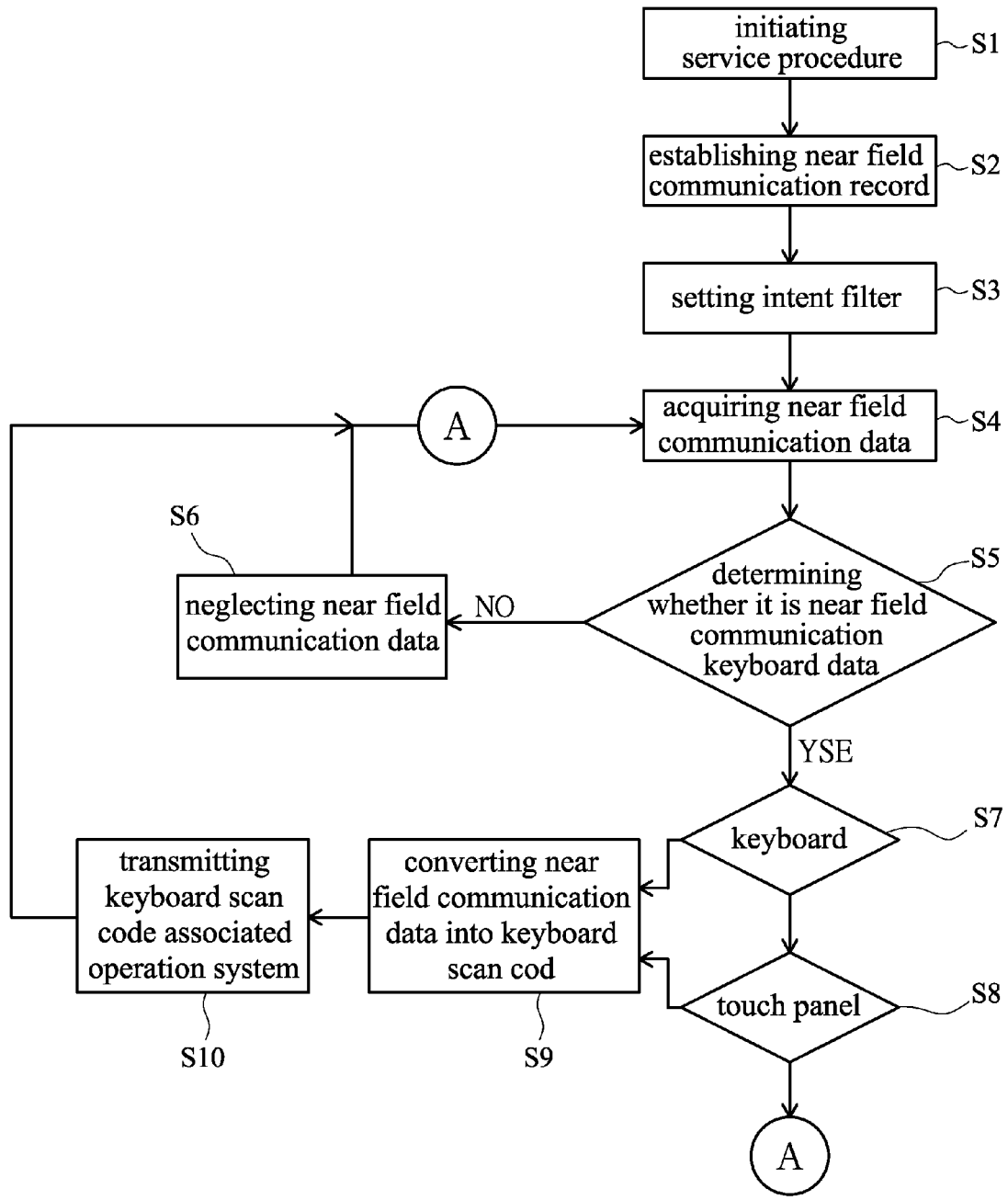
FIG. 4 is a flow chart illustrating a process of transmission through near field communication (NFC) according to the present invention.

To put the present invention into use, all the character input keys 241 are arranged on a surface of a carrier 25 and the matching unit 21, the current processing unit 22, the wireless communication interface 23, and the operation processing unit 24 are arranged inside the carrier 25 to form, as a whole, a wireless operation mechanism 2. The carrier 25 can be designed in the form of foldable or expandable tablet and is provided, at a suitable location, with at least one disposition zone 251 to as to form a configuration of a keyboard (as shown in FIG. 2). Alternatively, besides the carrier 25 of the wireless operation mechanism being constructed as a configuration of a keyboard, as that illustrated in FIG. 2, the carrier 25a can be constructed in a configuration of a joystick, as shown in FIG. 3 so that in operation, the portable electronic device 1 and the carrier 25a can be combined together in such a way that the character input keys 241a of the carrier 25a are located on two sides of the portable electronic device 1, making the present invention meet the needs of practical uses.

To acquire electrical power for use, the portable electronic device 1 can be positioned in or on the disposition zone 251 of the wireless operation mechanism 2 to allow the device-side matching unit 11 of the portable electronic device 1 and the matching unit 21 of the wireless operation mechanism 2 to carry out an operation of impedance matching and to allow the portable electronic device 1 to use the near field communication unit 131 to supply radio frequency energy via the device-side matching unit 11 to the wireless operation mechanism 2 and to allow the radio frequency unit 12 to function as a power supply for electrically charging the wireless operation mechanism 2. The rectifier 221 and the voltage regulator 222 of the current processing unit 22 are used to rectify the charging signal of the radio frequency unit 12 for being supplied to and used by the wireless communication interface 23 and the operation processing unit 24 of the wireless operation mechanism 2 so as to allow the wireless operation mechanism 2 and the portable electronic device 1 to proceed with handshaking communication. The operation processing unit 24 is operated in combination with the character input keys 241 to execute an input operation so that the wireless operation mechanism 2 may use electric power from the portable electronic device 1 without being equipped with an own power supply.

Further, when the portable electronic device 1 and the wireless operation mechanism 2 are to carry out shaking communication, at least the following two ways can be used:

(1) When the wireless operation mechanism 2 is brought to approach or contact the portable electronic device 1 to carry out shaking communication, the wireless operation mechanism 2 issues, via the Bluetooth communication unit 232, information of data exchange format to request for connection and the message processing unit 14 of the portable electronic device 1 receives, via the Bluetooth communication unit 132, the Bluetooth communication data of the wireless operation mechanism 2 transmitted from the device-side wireless communication interface 13, and, after processing with the message processing unit 14, allowing the wireless operation mechanism 2 and the portable electronic device 1 to establish communication connection with each other so that the wireless operation mechanism 2 may use the character input keys 241 thereof to achieve the purpose of operating the portable electronic device 1.

(2) Alternatively, when the wireless operation mechanism 2 approaches or contacts the portable electronic device 1 to carry out handshaking communication, the wireless operation mechanism 2 issues information of data exchange format for near field communication and the message processing unit 14 screens and determines whether it is data exchange information transmitted from the wireless operation mechanism 2 and intercepts and processes, in priority, the information and converts the information into useful key (or touch panel) data. A system information procedure is then started to transmit the converted key (or touch screen) data to the message processing unit 14. The message processing unit 14 is operable with the following steps S1-S10 (see FIG. 4):

(1) Initiating service procedure S1: The message processing unit 14 of the portable electronic device 1 is first activated as a service procedure.

(2) Establishing near field communication record S2: The near field communication unit 231 is operable to establish and register a record of near field communication data exchange format belonging to the wireless operation mechanism 2.

(3) Setting intent filter S3: A target intent filter is set and registered to make the privilege of the target intent filter priority privilege.

(4) Acquiring near field communication data S4: The near field communication unit 131 receives near field communication data of the wireless operation mechanism 2 transmitted from the device-side wireless communication interface 13.

(5) Determining whether it is near field communication keyboard data S5: The message processing unit 14 proceeds with analysis of the above near field communication data and determines if the near filed communication data is a keyboard (keys) or a touch panel of the portable electronic device 1 or it cannot be determined. If it is positive that it cannot be determined then the near field communication data is neglected S6 and the step of acquiring near field communication data S4 is repeated. When the message processing unit 14 determines the near field data is the keyboard (keys) S7 or touch panel S8 of the portable electronic device 1, the near field communication data is converted into keyboard scan cod S9 (meaning being converted into useful keyboard data for the portable electronic device 1), and the keyboard scan code is transmitted to an associated operation system S10 to allow the wireless operation mechanism 2 to use the character input keys 241 to achieve the purpose of operating the portable electronic device 1 thereby improving the process of operating an input method to eliminate incompatibility incurring in the process of input of multiple language systems.

In summary, the present invention provides a power-free wireless operation device applicable to a portable electronic device, which effectively overcomes the shortcomings of the prior art device by allowing a keyboard to use the electrical power from the portable electronic device so that the keyboard does not require an own power supply. Thus, the present invention allows for significant reduction of the size of a wireless operation device and, in manufacture and production, a design can be adopted to achieve the features of being light, thin, and compact and being readily foldable for easy carrying and providing an effect of environmental protection through regeneration.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A combined operation system, comprising a portable electronic device and a wireless operation mechanism operable in combination with the portable electronic device, wherein:

the portable electronic device comprises:
  a device-side matching unit, which functions for impedance matching and supplying radio frequency energy to the wireless operation mechanism;
  a radio frequency unit, which is connected to the device-side matching unit for supplying electric power;
  a device-side wireless communication interface, which is connected to the device-side matching unit for achieving wireless connection; and
  a message processing unit, which is connected to the device-side wireless communication interface for analyzing and converting information; and the wireless operation mechanism comprises:
  a matching unit, which is for impedance matching with the device-side matching unit to acquire the radio frequency energy;
  a current processing unit, which is connected to the matching unit to proceed with rectification of the acquired radio frequency energy into electric power;
  a wireless communication interface, which is connected to the matching unit and the current processing unit and, after receiving electrical power, proceeds with handshaking communication with the device-side wireless communication interface; and
  an operation processing unit, which is connected to the current processing unit and the wireless communication interface and, after receiving electrical power, is operable to generate an input instruction that is applied, through the wireless communication between the wireless communication interface and the device-side wireless communication interface, to the portable electronic device for analysis and conversion performed with the message processing unit to execute the input instruction in the portable electronic device.

2. The combined operation system according to claim 1, wherein the device-side wireless communication interface comprises a near field communication unit and a Bluetooth communication unit.

3. The combined operation system according to claim 1, wherein the current processing unit comprises a rectifier and a voltage regulator connected to the rectifier.

4. The combined operation system according to claim 1, wherein the wireless communication interface comprises a near field communication unit and a Bluetooth communication unit.

5. The combined operation system according to claim 1, wherein the operation processing unit is connected to a plurality of character inputs key for executing an input operation to generate the input instruction.

* * * * *